(12) United States Patent
Kim et al.

(10) Patent No.: US 7,342,444 B2
(45) Date of Patent: Mar. 11, 2008

(54) POWER AMPLIFYING APPARATUS USING ASYMMETRIC POWER DRIVE

(75) Inventors: Bumman Kim, Kyungsangbuk-do (KR); Jeonghyeon Cha, Kyungsangbuk-do (KR); Jangheon Kim, Kyungsangbuk-do (KR); Ildu Kim, Kyungsangbuk-do (KR)

(73) Assignee: Postech Foundation, Kyungsangbuk-Do (KR)

( * ) Notice: Subject to any disclaimer, the term of this patent is extended or adjusted under 35 U.S.C. 154(b) by 121 days.

(21) Appl. No.: 11/316,815

(22) Filed: Dec. 27, 2005

(65) Prior Publication Data

US 2006/0145757 A1 Jul. 6, 2006

(30) Foreign Application Priority Data

Dec. 31, 2004 (KR) ............... 10-2004-0117788

(51) Int. Cl.
*H03F 3/68* (2006.01)
(52) U.S. Cl. .................. 330/124 R; 330/295
(58) Field of Classification Search ............ 330/124 R, 330/295, 84, 126
See application file for complete search history.

(56) References Cited

U.S. PATENT DOCUMENTS 6,639,464 B2 * 10/2003 Hellberg ................ 330/124 R
6,737,922 B2   5/2004 Pengelly et al.
7,145,387 B2 * 12/2006 Hellberg ................ 330/124 R
2003/0076167 A1  4/2003 Hellberg
2004/0041627 A1  3/2004 Kim et al.
2004/0082354 A1  4/2004 Cohen
2004/0113698 A1 * 6/2004 Kim et al. .............. 330/295
2004/0212437 A1 10/2004 Kim

FOREIGN PATENT DOCUMENTS

EP          1 267 483        12/2002
KR    10-2004-0019779         3/2004

OTHER PUBLICATIONS

Youngoo Yang et al., "A Fully Matched N-Way Dohetry Amplifier With Optimized Linearity", proceeding to IEEE Transaction on Microwave theory and techniques, vol. 51, No. 3, Mar. 2003.
Youngoo Yang et al., "A Microwave Doherty Amplifier Employing Envelope Tracking Technique for High Efficiency and Linearity", proceeding to IEEE Microwave and Wireless Components Letters, vol. 13, No. 9, Sep. 2003.
Fumitaka Ilzuka et al., "Highly-Efficient Doherty Linear Amplifier with Input Power Allocation Control for Portable Radio", IEICE Trans. Electron, vol. E87-C, No. 6 Jun. 2004, pp. 915-923, XP-001196538.

* cited by examiner

*Primary Examiner*—Henry Choe
(74) *Attorney, Agent, or Firm*—Bacon & Thomas, PLLC

(57) ABSTRACT

A power amplifying apparatus includes a Doherty amplifier having a carrier amplifier and a peaking amplifier connected in parallel, each having an input/output matching circuit and an asymmetric power driver for driving the carrier amplifier and the peaking amplifier using an asymmetric power driver.

8 Claims, 16 Drawing Sheets

POWER AMPLIFYING APPARATUS USING ASYMMETRIC POWER DRIVE

FIELD OF THE INVENTION

The present invention relates to a high efficiency and linearity power amplifying apparatus; and, more particularly, to a power amplifying apparatus using an asymmetric power drive, which employs a microwave Doherty amplifier.

BACKGROUND OF THE INVENTION

As well-known in the art, a Doherty power amplifier has a structure of a carrier and a peaking amplifier connected in parallel by using a quarter-wave transformer ($\lambda/4$ line). Further, the Doherty amplifier is driven by a symmetrical power driving method in which the peaking amplifier controls a load impedance of the carrier amplifier by increasing the amount of current supplied to the load from the peaking amplifier as the power level is increased, thereby improving efficiency.

A microwave Doherty amplifier has been used in an amplitude modulation (AM) transmitter of a broadcasting apparatus using a high-power low-frequency (LF) vacuum tube or a medium frequency (MF) vacuum tube. There have been a variety of proposals for implementing the microwave Doherty amplifier with a solid-state device without using a vacuum tube, and numerous researches have been conducted to implement the proposals.

A Doherty amplifier employing an asymmetric power driving method has achieved high efficiency and linearity. Especially, the Doherty amplifier employed in base stations and handsets for mobile communications is implemented by using approximately same-sized solid-state devices, the same input and output matching circuits and an input power drive. In this case, a carrier amplifier is biased as a class AB, and a peaking amplifier a class C. Since the peaking amplifier has a lower bias than that of the carrier amplifier, it is problematic that the current level of the peaking amplifier is always lower than that of the carrier amplifier depending on a power level.

FIG. 1 shows the amplitude of a current component according to each bias level, i.e., a conduction angle. As illustrated in FIG. 1, a fundamental current component's amplitude of the peaking amplifier biased at a lower level is lower than that of the carrier amplifier. The carrier amplifier whose bias point is the class AB has a conduction angle ranging from $\pi$ to $2\pi$ and, therefore, has the amplitude of the fundamental current component ranging from 0.5 to 0.536 at a maximum input power. Meanwhile, the peaking amplifier operated in the class C has a conduction angle ranging from 0 to $\pi$ and, thus, has the amplitude of the fundamental current component ranging from 0 to 0.5. Accordingly, the fundamental current component of the peaking amplifier does not reach that of the carrier amplifier. As a result, a load modulation (a phenomenon in which load impedance of the front end of a current source varies with an amplitude of current generated from the current source) occurs and, further, serious problems are caused in the Doherty operation.

Moreover, as shown in FIG. 9A to be described later, due to the lower bias level of the peaking amplifier, the fundamental current component of the peaking amplifier is detected only when a driving voltage thereof is equal to or higher than a certain level.

Therefore, if the carrier amplifier is driven at a maximum input power, the fundamental current component level of the peaking amplifier is lower than that of the carrier amplifier and, further, the peaking amplifier is not driven at the required maximum input power, thereby generating a much lower fundamental current. As a result, the Doherty amplifier is not able to generate a desired maximum output power.

In order to overcome the above-described problems, a research finding has been published regarding considerably improved a typical Doherty amplifier in terms of a maximum output power while maintaining the high efficiency thereof by employing an envelope tracking device or an input power tracking device. Further, various researches have been done in order to actually implement the Doherty amplifier in a microwave bandwidth, and one of them is shown in FIG. 2.

A Doherty amplifier shown in FIG. 2 includes a carrier amplifier 204 and a peaking amplifier 206 in parallel; a power divider 200 for providing a same power to the carrier amplifier 204 and the peaking amplifier 206; a transmission line 202 for synchronizing phases between the carrier amplifier 204 and the peaking amplifier 206; an offset line 208 for generating a proper load modulation by increasing an impedance output while the peaking amplifier 206 is not operating; and quarter-wave transmission lines 210 and 212 for performing the Doherty operation.

Such Doherty amplifier as in FIG. 2 is implemented in a manner that the carrier amplifier and the peaking amplifier have the same input/output matching circuits and yields the same output, so that a maximum output can be produced by each Doherty amplifier. Further, by sequentially providing the output matching circuits and, in turn, the offset line 208 at output ends of transistors in the carrier and the peaking amplifiers, an imaginary part as well as a real part can be matched, thereby enabling the Doherty operation while obtaining the maximum output power. (See, Y. Yang et al, "Optimum Design for Linearity and Efficiency of Microwave Doherty Amplifier Using a New Load Matching Technique," Microwave Journal, Vol 44, No. 12, pp. 20-36, December 2002.)

Further, FIG. 3 provides an N-way Doherty amplifier having an optimum design for efficiency and linearity while improving a typical Doherty amplifier (See, Y. Yang et al, "A Fully Matched N-way Doherty Amplifier with Optimized Linearity," *IEEE Trans. Microwave Theory and Tech.*, Vol. 51, No. 3, pp. 986-993, March 2003.)

Unlike the configuration shown in FIG. 2, the N-way Doherty amplifier illustrated in FIG. 3 performs the Doherty operation with a single carrier amplifier 302 and a (N−1)-number of peaking amplifiers 304. Further, an N-way splitter 300 is used for putting the same input into the single carrier amplifier 302 and the peaking amplifiers 304.

FIG. 4 presents an N-stage Doherty amplifier for gradually achieving high efficiency from a much lower power level in comparison with a general Doherty amplifier (See, N. Srirattana et al, "Analysis and design of a high efficiency multistage Doherty amplifier for WCDMA," EuMC Digest 2003, Vol. 3, pp. 1337-1340, October 2003.) The Doherty amplifier shown in FIG. 4 has an N-way power divider 400 for performing the Doherty operation by putting the same input into a single carrier amplifier 402 and a (N−1)-number of peaking amplifiers 404.

The following is a brief explanation of the Doherty amplifier. First of all, the carrier amplifier 402 is turned on and, then, a first peaking amplifier $PA_1$ is turned on, to perform the Doherty operation. Thereafter, both of the carrier amplifier 402 and the first peaking amplifier $PA_1$ serve as a carrier amplifier while a second peaking amplifier $PA_2$ serves as a peaking amplifier, thereby performing the Doherty operation together. Such operation is carried out up to a last peaking amplifier $PAN_{N-1}$. As the Doherty operation is performed gradually and successively as described above, maximum efficiency can be obtained from a much lower power level. Further, it is also possible to repeatedly obtain the maximum efficiency over intermediate power levels, so that high efficiency can be obtained over a full power level.

In the meantime, in order to solve a problem in which the Doherty amplifier do not produce a maximum power output due to a low bias when the Doherty amplifier is implemented by using a solid-state device, there has been proposed a Doherty amplifier by using an envelope tracking device (See, Y. Yang et al, "A Microwave Doherty Amplifier Employing Envelope Tracking Technique for High Efficiency and Linearity", IEEE Microwave and Wireless Components Letters, Vol. 13, No. 9, September 2003., and J. Cha et al, "An Adaptive Bias Controlled Power Amplifier with a Load-Modulated Combining Scheme for High Efficiency and Linearity", *IEEE MTT-S Int. Microwave Sympo*. Vol. 1, pp. 81-84, June 2003.) However, even in the proposed Doherty amplifier, an additional device for controlling the power level of the peaking and the carrier power amplifiers is still required in order to achieve an improved linearity and the maximum output.

SUMMARY OF THE INVENTION

It is, therefore, an object of the present invention to provide a Doherty amplifier using an asymmetric power drive, to thereby achieve optimized linearity while maintaining high efficiency.

It is another object of the present invention to provide a power amplifying apparatus using the Doherty amplifier.

In accordance with an aspect of the present invention, there is provided a power amplifying apparatus, which includes: a carrier amplifier and a peaking amplifier connected in parallel; and asymmetric power driving means for driving the carrier amplifier and the peaking amplifier using an asymmetric power drive.

In accordance with another aspect of the present invention, there is provided a power amplifying apparatus, which includes: a Doherty amplifier having N-number of amplifiers connected in parallel, the N-number of amplifiers including a single carrier amplifier and (N-1)-number of peaking amplifiers; asymmetric power driving means for driving the N-number of amplifiers using an asymmetric power drive; and a Doherty network, connected to an output end of the Doherty amplifier, for controlling a load impedance of the amplifying apparatus to derive a load modulation of the Doherty amplifier.

In accordance with further another aspect of the present invention, there is provided a Doherty power amplifier, which includes: a carrier amplifier and one or more peaking amplifiers connected in parallel, each having input and output matching circuits, wherein the input and outputs matching circuits in the carrier and the peaking amplifiers are made different from each other in a manner that load impedances of the carrier and the peaking amplifiers are reduced for proper power matching.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Hereinafter, preferred embodiments of the present invention will be described in detail with reference to the accompanying drawings.

Figure 5:
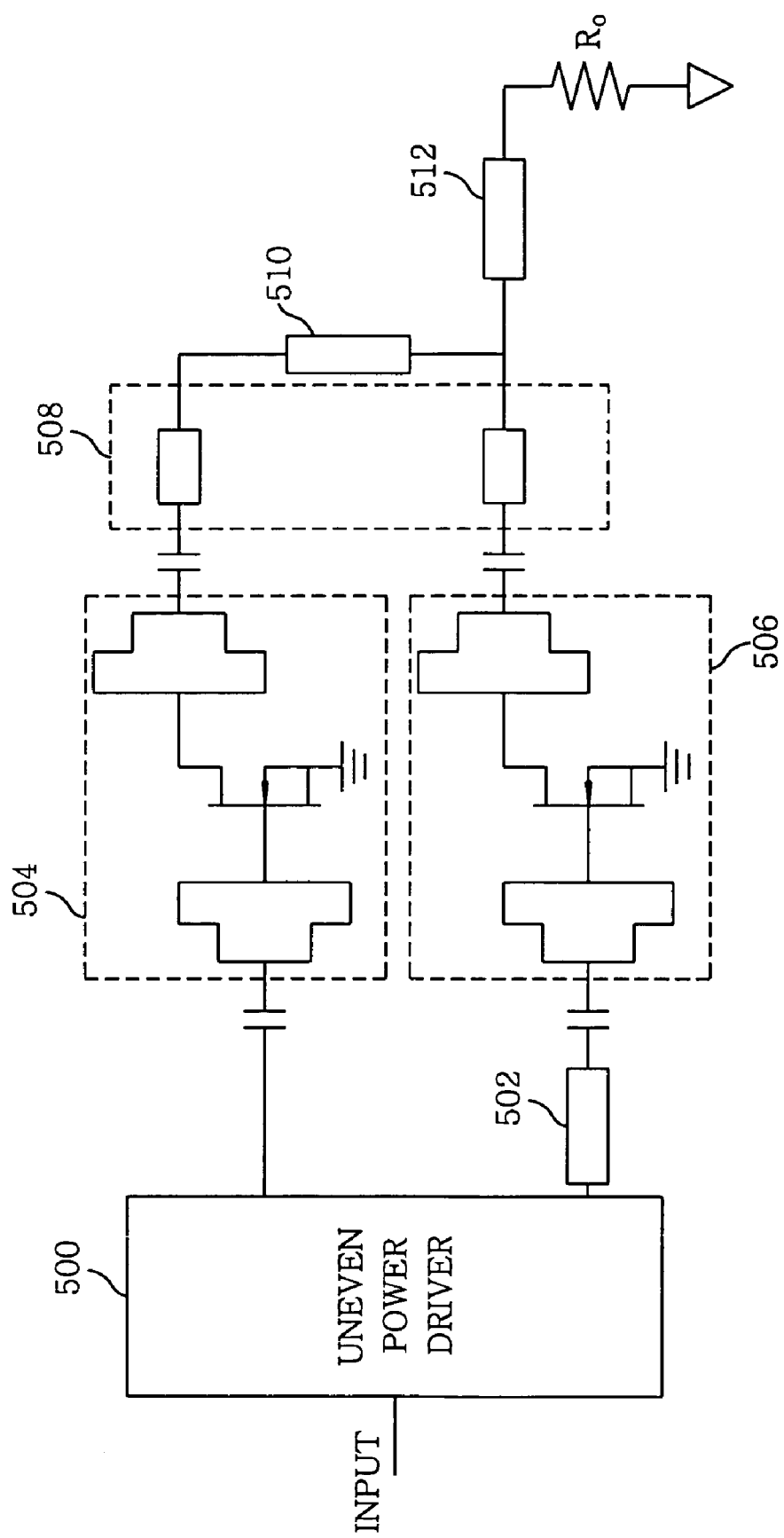
FIG. 5 offers an exemplary block diagram of an N-way (N=2) power amplifying apparatus using an asymmetric power drive in accordance with a preferred embodiment of the present invention.

FIG. 5 offers a block diagram of an N-way (in case of N=2) power amplifying apparatus using an asymmetric power drive in accordance with a preferred embodiment of the present invention. The power amplifying apparatus shown in FIG. 5 includes an asymmetric power driver 500, a transmission line 502, a carrier amplifier 504 and a peaking amplifier 506 connected in parallel, an offset line 508, a first quarter-wave transmission line 510 and a second quarter-wave transmission line 512.

The carrier amplifier 504 forms a Doherty amplifier together with the peaking amplifier 506. The carrier and the peaking amplifier 504 and 506 have the same input and output matching circuits, respectively.

The asymmetric power driver 500 performs an asymmetric power drive to the carrier and the peaking amplifier 504 and 506. Preferably, more power is supplied to the peaking amplifier 506 than to the carrier amplifier 504. Herein, a power capacity is measured in "gm" and a unit thereof is I/V. Further, the power capacity also denotes a device size.

With the asymmetric power driver 500, asymmetric power is provided to the carrier and the peaking amplifiers 504 and 506 without providing the symmetric power to the carrier and the peaking amplifiers 504 and 506 as in a conventional case. The asymmetric power driver 500 will be described in detail with reference to FIG. 12.

The transmission line 502 serves to synchronize phases between the carrier and the peaking amplifiers 504 and 506. More specifically, the transmission line 502 allows each of the amplifiers 504 and 506 to have the same input/output matching circuits so that each of the amplifiers can output at the same characteristic impedance, e.g., 50 Ohm, thereby enabling the production of a maximum output from the Doherty amplifier.

Alternatively, the power amplifying apparatus according to the present invention can also be implemented in a manner that a maximum output is obtained from the Doherty amplifier by forming different input and output matching circuits in the carrier and the peaking amplifiers 504 and 506. To do so, the load impedances of the carrier and the peaking amplifiers must be reduced appropriately for better linearity and also for proper power matching. Especially, because the bias point of the peaking amplifier is lower than that of the carrier amplifier, the load impedance of the peaking amplifier must be reduced more than that of the carrier amplifier, as shown in FIG. 10B, to thereby achieve a better linearity and a proper power matching.

The offset line 508 permits to occur a proper load modulation by increasing impedance output while the peaking amplifier 506 is not operating.

The first quarter-wave transmission line 510 serves as an impedance inverter, thereby implementing the Doherty operation. For example, the first quarter-wave transmission line 510 reverses an output as $2R_o$, where $R_o$ denotes load impedance. The second quarter-wave transmission line 512 changes load impedance from 50 Ohm to 25 Ohm. In this case, since the Power amplifying apparatus is formed by connecting a single carrier amplifier 504 and a (N−1)-number of peaking amplifiers 506 in parallel, the load impedance thereof should be made to have $R_o/N$ with respect to a characteristic impedance of 50 Ohm. For example, FIG. 5 shows the 2-way power amplifying apparatus (i.e., N=2) and, therefore, there should be provided the second quarter-wave transmission line 512 for changing the load impedance from 50 Ohm to 25 Ohm, wherein the characteristic impedance of the second quarter-wave transmission line 512 can be expressed as $\sqrt{(50 \times 25)}$ Ohm.

As described above, the power amplifier shown in FIG. 5 is implemented by employing the asymmetric power driver 500, and has a configuration a parallel connection of the input/output matched carrier and peaking amplifiers 504 and 506. In this case, output ends of the two amplifiers 504 and 506 are implemented through a Doherty network composed of the offset line 508 and a quarter-wave transformer (λ/4 line) with the first and the second quarter-wave transmission lines 510 and 512.

Figure 6:
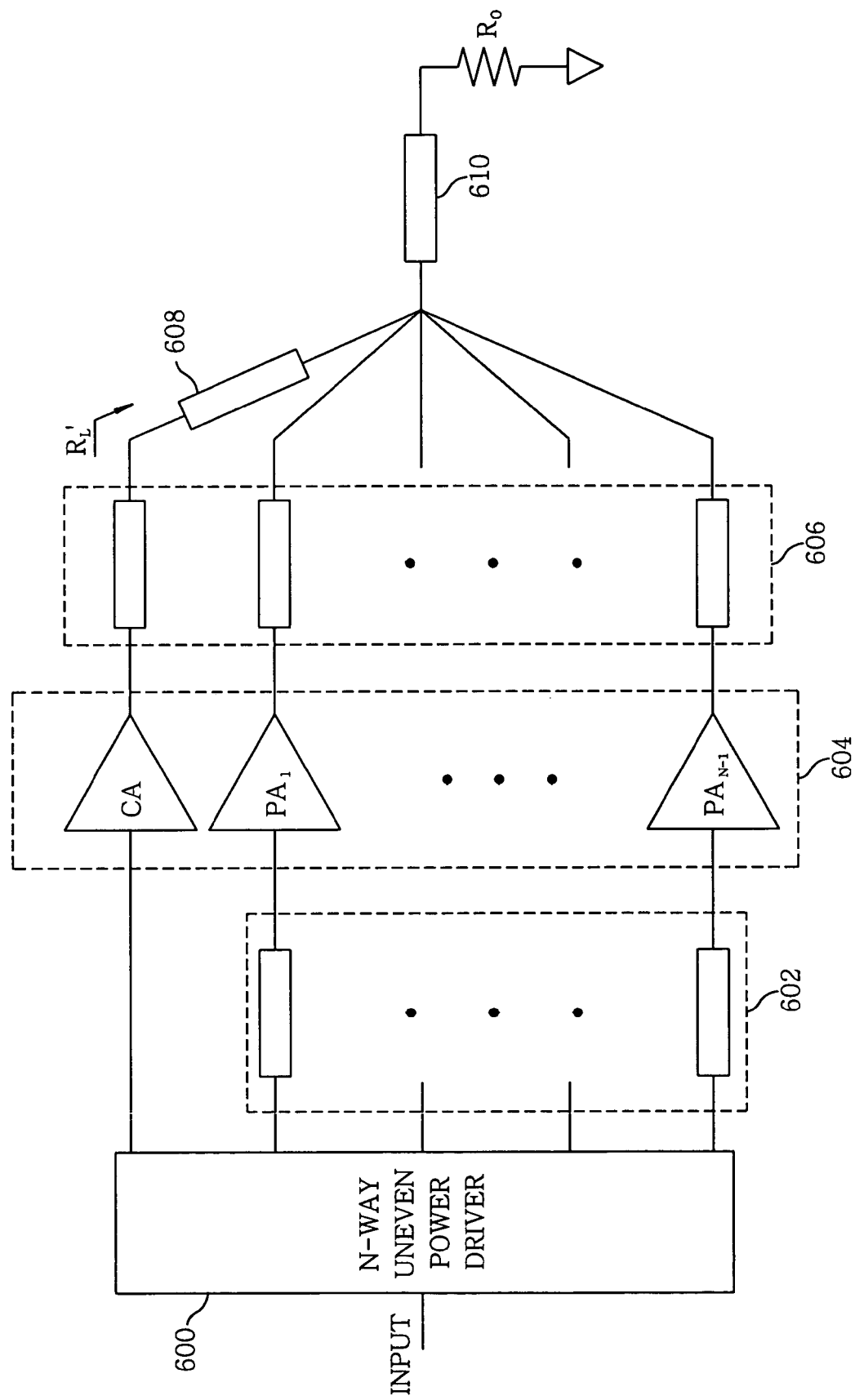
FIG. 6 presents a block diagram of an N-way (where N is a positive integer equal to or greater than 2) power amplifying apparatus using an asymmetric power drive in accordance with another preferred embodiment of the present invention.

FIG. 6 illustrates an N-way (where N is an integer equal to or greater than 2) power amplifying apparatus in accordance with another preferred embodiment of the present invention. The N-way Power amplifying apparatus includes an N-way asymmetric power driver 600, a transmission line block 602, a Doherty amplifier 604, an offset line 606 and a first and a second quarter-wave transmission line 608 and 610.

The Doherty amplifier 604 is composed of N-number of amplifiers including a single carrier amplifier CA and the (N−1)-number of peaking amplifiers $PA_1$ to $PA_{(N-1)}$, wherein each of the amplifiers has therein input and output matching circuits.

The N-way asymmetric power driver 600 performs an asymmetric power drive on the carrier amplifier CA and the (N−1)-number of peaking amplifiers $PA_1$ to $PA_{(N-1)}$, respectively. In accordance with the present invention, each power supplied to the (N−1)-number of peaking amplifiers is equal to or higher than that supplied to the carrier amplifier by more than a specific value. In this regard, the N-way asymmetric power driver 600 can make the (N−1)-number of peaking amplifiers in an asymmetric power drive or a symmetric power drive. That is, either a same power or a separate power can be provided to each of the peaking amplifiers.

Alternatively, it is also possible to allow the N-way asymmetric power driver 600 to respectively provide different input ratios to the input matching circuits in the peaking amplifiers.

Moreover, in order to perform the asymmetric power drive, it is possible to make the input/output matching circuits same in the carrier amplifier and the (N−1)-number peaking amplifiers. Alternatively, the carrier amplifier and the (N−1)-number peaking amplifiers can have different input and output matching circuits from each other, wherein the input and the output matching circuits in the (N−1)-number peaking amplifiers all have the same or different configurations.

Figure 7:
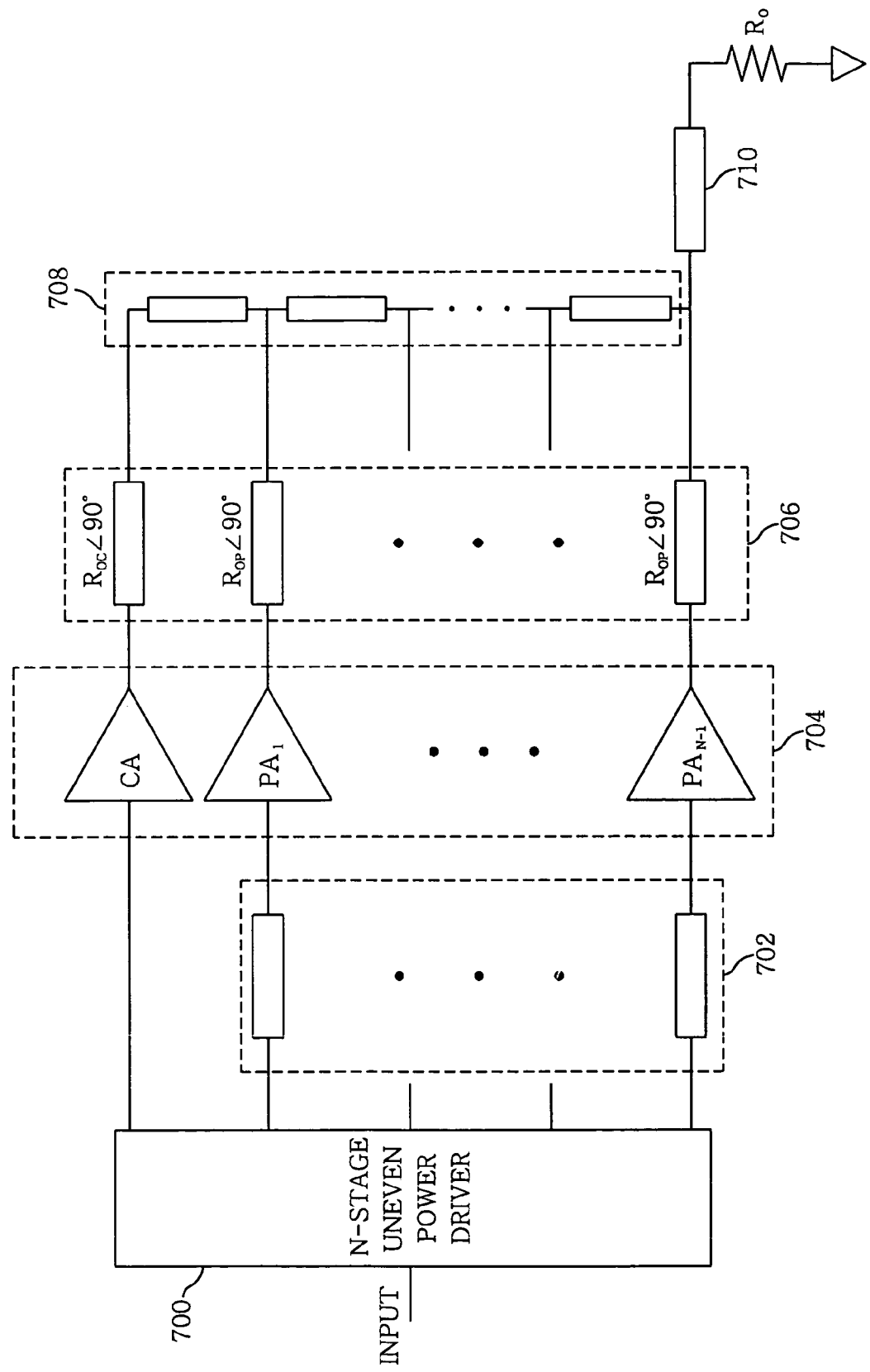
FIG. 7 illustrates a block diagram of an N-stage (where N is a positive integer equal to or greater than 2) power amplifying apparatus using an asymmetric power drive in accordance with further another preferred embodiment of the present invention.

FIG. 7 depicts an N-stage (where N is a positive integer equal to or greater than 2) power amplifying apparatus in accordance with further another preferred embodiment of the present invention. The N-stage Power amplifying apparatus includes an N-stage asymmetric power driver 700, a transmission line 702, a Doherty amplifier 704, an offset line 706, an N-number of first quarter-wave transmission lines 708 and a second quarter-wave transmission lines 708 and 710. As shown in FIG. 6, the Doherty amplifier 704 is composed of N-number of amplifiers including a single carrier amplifier CA and (N−1)-number of peaking amplifiers $PA_1$ to $PA_{(N-1)}$, wherein each of the carrier and the peaking amplifiers has therein input and output matching circuits.

Figure 4:
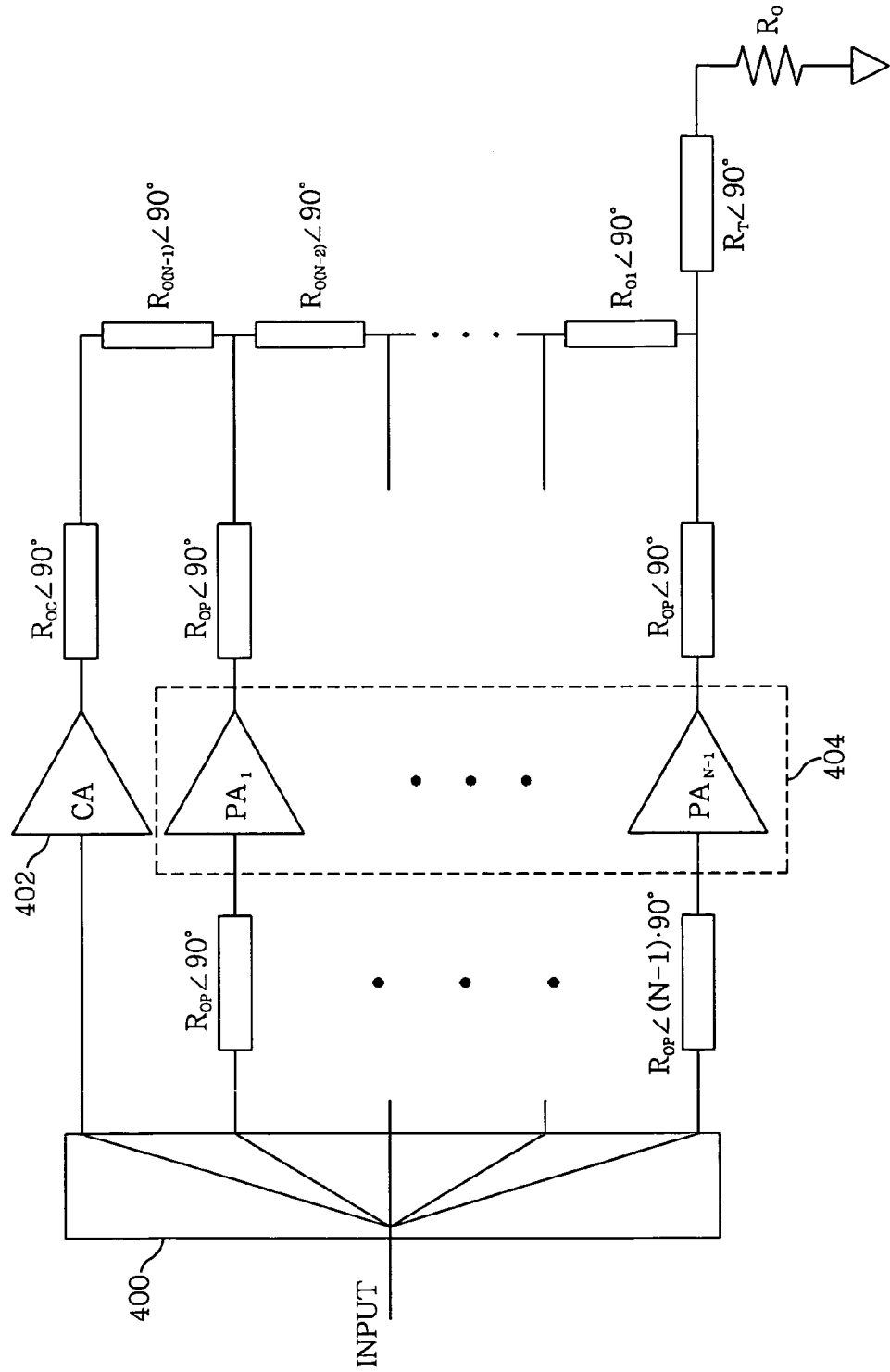
FIG. 4 illustrates a block diagram of conventional N-stage Doherty power amplifying apparatus employing a symmetric power driver.

The embodiment described in FIG. 7 is substantially the same as that shown in FIG. 6 except that the first quarter-wave transmission lines 708 have a cascade connection. The Doherty amplifier gradually perform a Doherty operation in a manner similar to the power amplifier shown in FIG. 4. That is, the carrier amplifier CA is turned on and then a first peaking amplifier $PA_1$ is turned on, thereby performing the Doherty operation. Next, both the carrier amplifier CA and the first peaking amplifier $PA_1$ serve as a carrier amplifier together and, further, the second peaking amplifier $PA_2$ serves as a peaking amplifier, thereby performing the Doherty operation. With such configuration, maximum efficiency can be obtained from a much lower power level and, further, it is also possible to obtain the maximum efficiency at an intermediate level, so that high efficiency can be obtained over a full power range.

The N-stage asymmetric power driver 700 performs a symmetric power drive on the carrier amplifier CA and the peaking amplifiers $PA_1$ to $PA_{(N-1)}$. More specifically, the power supplied to the (N−1)-number of peaking amplifiers is higher than that supplied to the carrier amplifiers by more than a specific value.

Alternatively, it is also possible to allow the N-stage asymmetric power driver 700 to provide asymmetric power having different input ratios to the input/output matching circuits in the peaking amplifiers. Furthermore, the carrier amplifier and the (N−1)-number of peaking amplifiers can have the same input/output matching circuits. Or, the carrier amplifier and each of the peaking amplifiers can have different input/output matching circuits from each other, wherein the input/output matching circuits in the peaking amplifiers can be either same or different.

Figure 1:
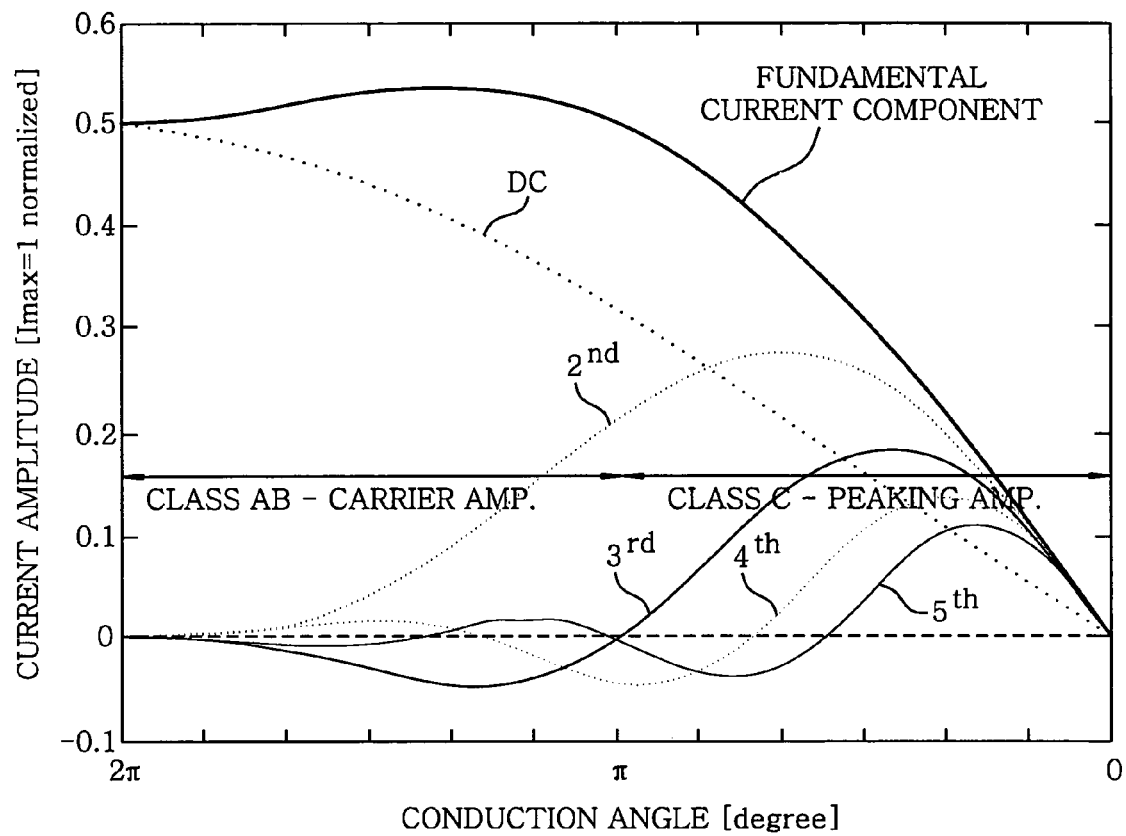
FIG. 1 shows a graph for comparing a fundamental current component between a carrier amplifier and a peaking amplifier in a conventional Doherty amplifier.
Figure 2:
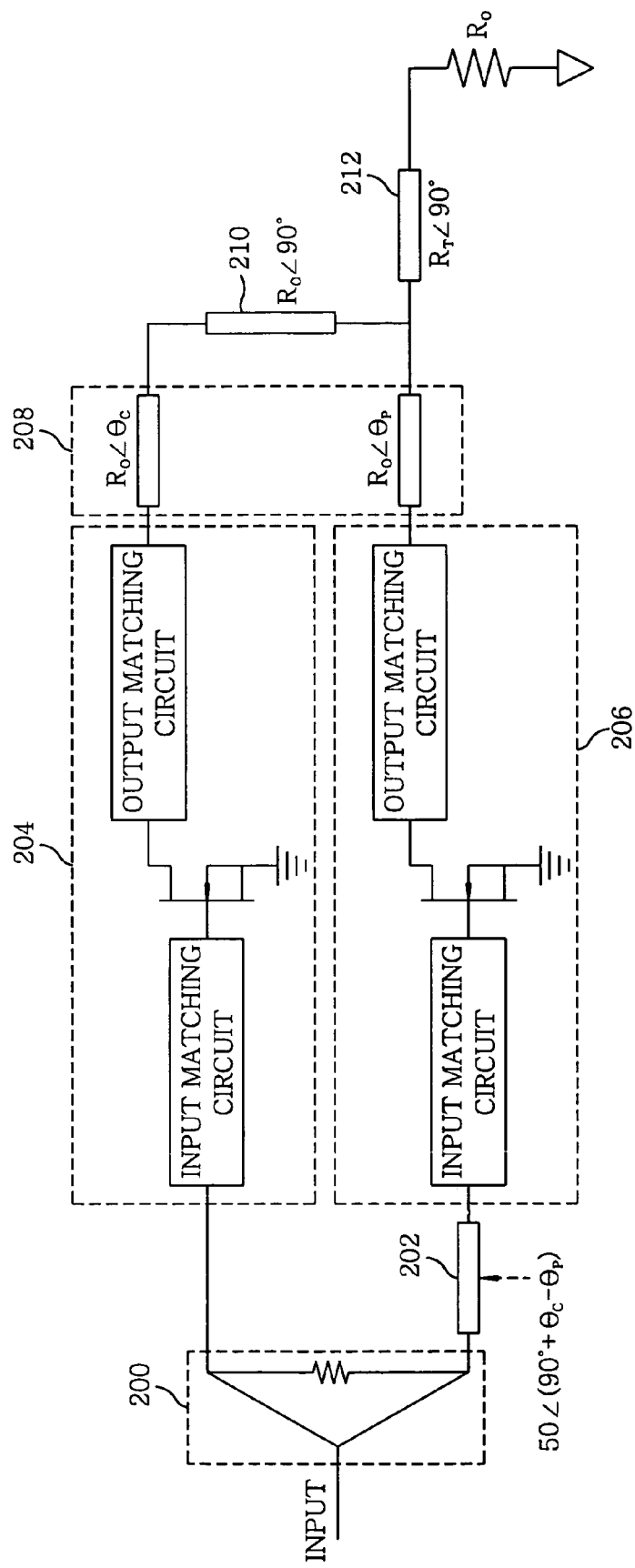
FIG. 2 describes a block diagram of a conventional Doherty amplifier.
Figure 3:
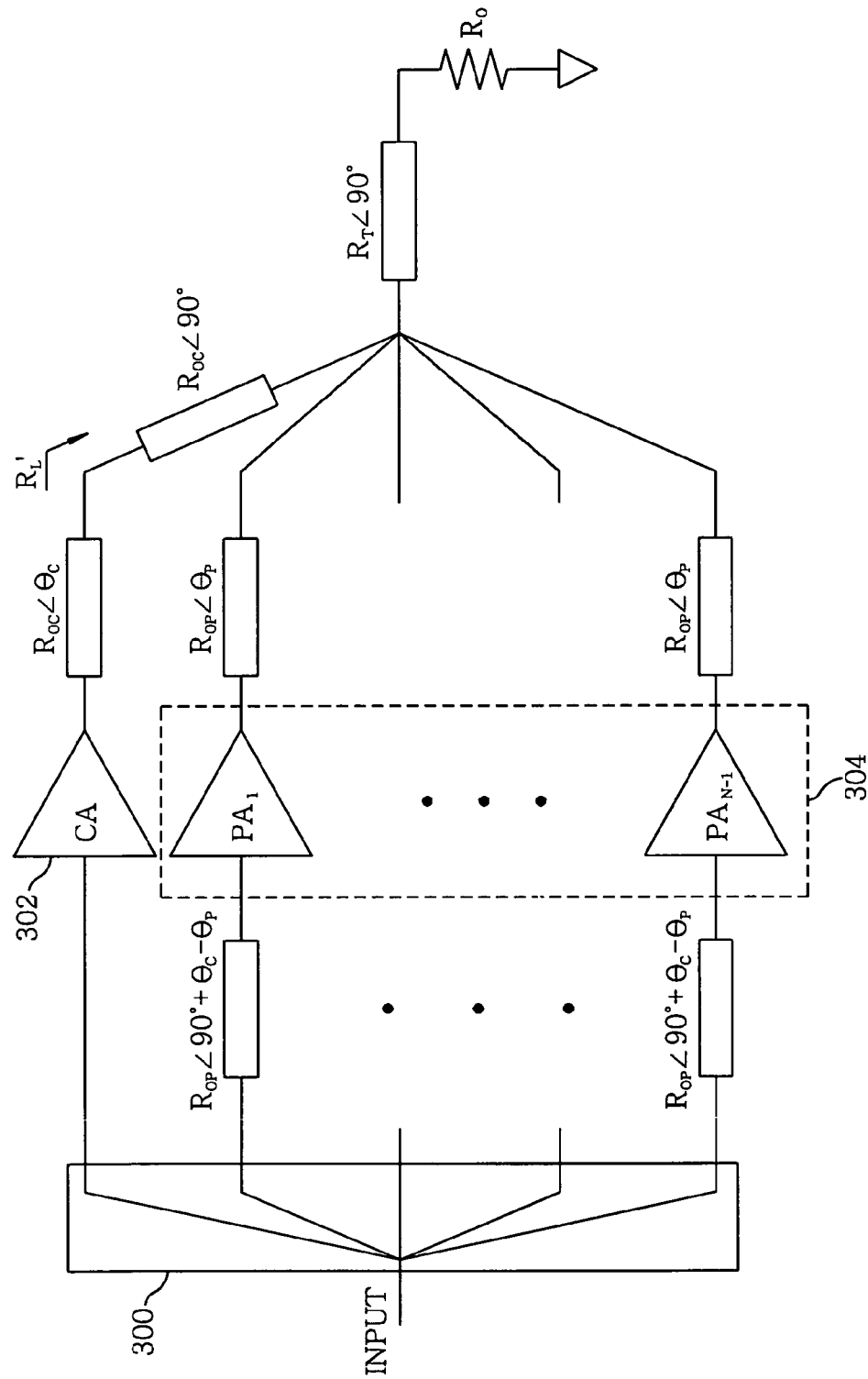
FIG. 3 provides a block diagram of conventional N-way Doherty power amplifying apparatus employing a symmetric power driver.

Meanwhile, as described in FIG. 1, the input/output matched carrier amplifier and peaking amplifiers have bias points biased as a class AB and a class C, respectively, and, therefore, they reveals the difference in the fundamental current components. At this time, the peaking amplifiers biased as the class C has less gain than the carrier amplifier. Accordingly, when the carrier amplifier reaches its maximum fundamental current level, the peaking amplifier does not reach its maximum fundamental current level. Such ratio is expressed by $\sigma$ defined as:

$$\sigma = \frac{I_{1,C}}{I_{1,P} \cdot (1-K)}, \qquad \text{Eq.1}$$

where $I_{1,C}$ and $I_{1,P}$ indicate the fundamental current components of the carrier amplifier and the peaking amplifiers, respectively; K denotes the portion of the voltage where the peaking amplifier starts to conduct; and $I_{1,P} \cdot (1-K)$ describes the fundamental current level of the peaking amplifier at the maximum input drive for the carrier amplifier.

Figure 8:
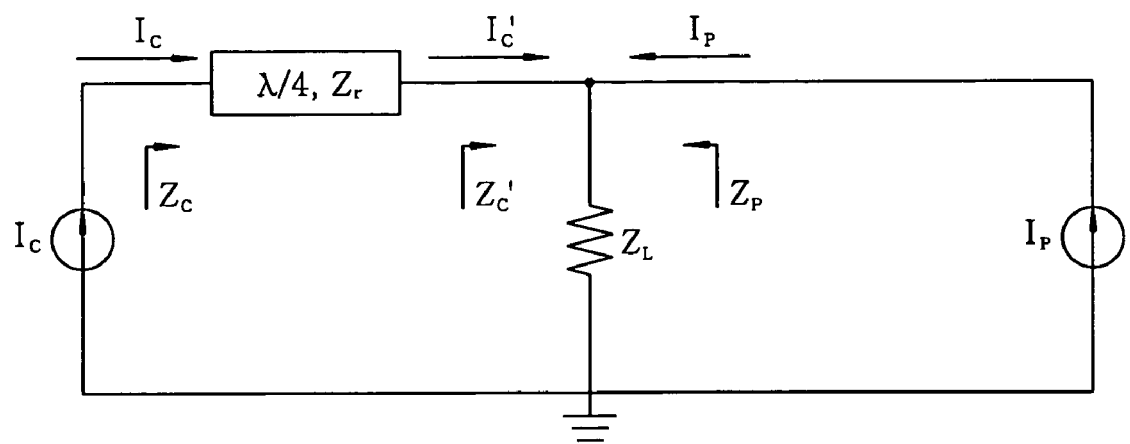
FIG. 8 depicts a diagram for explaining an operation principal of a Doherty amplifier in accordance with the present invention.

FIG. 8 presents a conceptual diagram of the Power amplifying apparatus using an asymmetric power drive in accordance with the present invention.

As illustrated in FIG. 8, a carrier amplifier and a peaking amplifier are respectively indicated as current sources $I_C$ and $I_P$, wherein load impedances of the carrier amplifier, the peaking amplifier and the Doherty amplifier are indicated as $Z_C$, $Z_P$ and $Z_L$, respectively.

First of all, in a low power region ($0<V_{in}<K \cdot V_{in,max}$), the peaking amplifier is turned off, which results in an open state of the current source $I_P$. Thus, the carrier amplifier operates depending on a quarter-wave transmission line ($=\lambda/4$ line) and the load impedance of the Doherty amplifier $Z_L$.

Further, in a high power region ($K \cdot V_{in,max}<V_{in}<V_{in,max}$), both the carrier and the peaking amplifiers operate and, thus, the load impedances of the amplifiers are determined by respective functions of the current sources, which are defined by the following Eq. 2.

$$Z_C = \begin{cases} \dfrac{Z_T^2}{Z_L}, & 0<v_{in}<K \cdot V_{in,\max} \\ \dfrac{Z_T^2}{Z_L \cdot (1+I_P/I_C)}, & K \cdot V_{in,\max}<v_{in}<V_{in,\max} \end{cases} \qquad \text{Eq.2}$$

$$Z_P = \begin{cases} \infty, & 0<v_{in}<K \cdot V_{in,\max} \\ Z_L\left(1+\dfrac{I_C}{I_P}\right), & K \cdot V_{in,\max}<v_{in}<V_{in,\max} \end{cases}$$

Figure 9A:
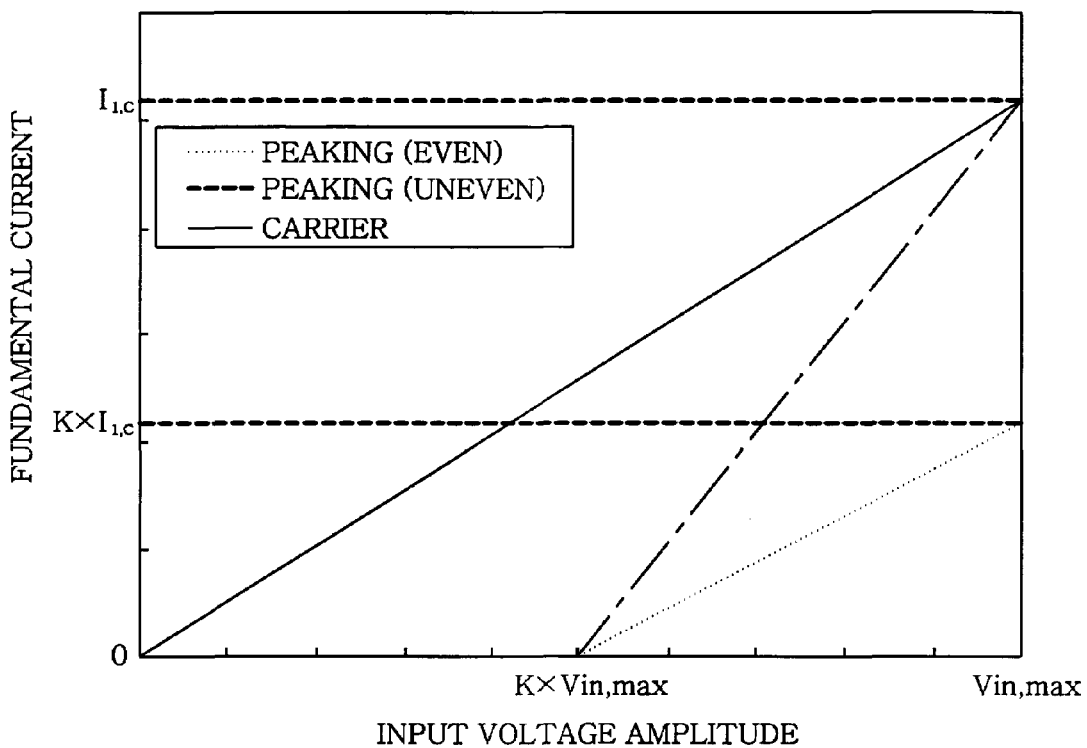
FIG. 9A describes a graph for comparing a fundamental current component to an input power level between the conventional Doherty power amplifying apparatus in FIG. 3 and the novel power amplifying apparatus in FIG. 6.

FIG. 9A expresses a graph for comparing fundamental current components according to an input voltage level between the conventional Doherty amplifier and the novel Power amplifying apparatus. The current components for the carrier amplifier and the peaking amplifier achieved through respective power driving can be expressed by a following Eq. 3 (herein, a symmetric power driven amplifier is indicated as "even", whereas an asymmetric power driven amplifier is indicated as "uneven"):

$$I_{P,even} = \begin{cases} I_{1,P}=0, & 0<v_{in}<K \cdot V_{in,\max} \\ \dfrac{I_{1,P}}{V_{in,\max}} v_{in} - K \cdot I_{1,P}, & K \cdot V_{in,\max}<v_{in}<V_{in,\max} \end{cases} \qquad \text{Eq.3}$$

$$I_{P,uneven} = \begin{cases} \sigma I_{1,P}=0, & 0<v_{in}<K \cdot V_{in,\max} \\ \dfrac{\sigma I_{1,P}}{V_{in,\max}} v_{in} - K \cdot \sigma I_{1,P}, & K \cdot V_{in,\max}<v_{in}<V_{in,\max} \end{cases}$$

where $K \cdot V_{in,max}$ indicates an input voltage level at which peaking amplifier of the class C is triggered at low bias.

As depicted in FIG. 9A, as the input power increases, the fundamental current component increases accordingly in the current source. At this time, if the input power is equally applied to the carrier amplifier and the peaking amplifier, the fundamental current component of the carrier amplifier reaches a maximum level, while the fundamental current components of the peaking amplifier does not reach the maximum level due to a bias difference to the carrier amplifier and the peaking amplifier. Therefore, as in the "even" mode (i.e., the symmetric power drive), there occurs a difference in the fundamental current component.

Figure 9B:
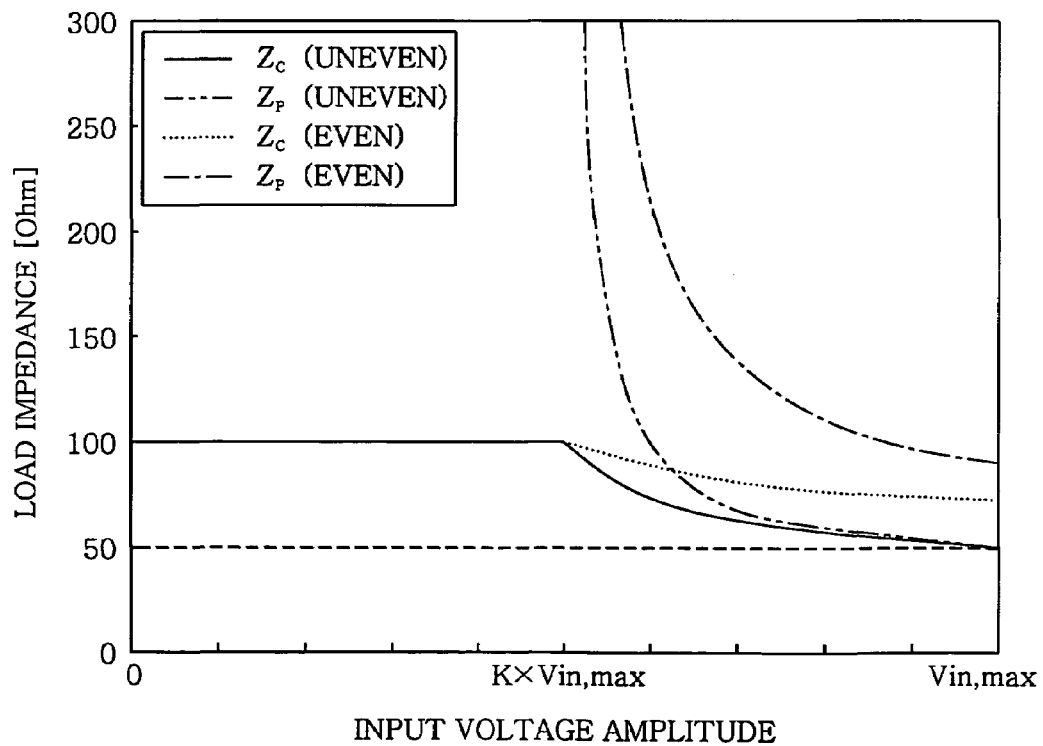
FIG. 9B shows a graph illustrating an impedance distribution to an input power level for explaining a load modulation occurred in the power amplifying apparatus shown in FIG. 6.

To overcome such issues, the present invention employs an "uneven" mode (i.e., the asymmetric power drive), to thereby equalize the fundamental current components of the carrier amplifier and the peaking amplifier depending on the maximum input power. FIG. 9B shows a graph illustrating a correlation between the load impedance and the input power level according to the fundamental current components of FIG. 9A.

As shown in FIG. 9B, in a low power level where only the carrier amplifier operates, the load impedances are the same, i.e., 100 Ohm, in both the asymmetric power drive and the symmetric power drive. In other words, in the low power level, only the carrier amplifier operates at the load impedance of 100 Ohm that is twice 50 Ohm. Therefore, the power amplifying apparatus is widely used so that the maximum efficiency can be achieved at a point corresponding to a ¼ of the maximum power thereof, which can be known by the load impedance. However, in a high power level, when the peaking amplifier just starts to conduct, the load impedance starts to decrease.

In the conventional amplifier using a symmetric power drive, the load modulation does not properly occur and, accordingly, the carrier amplifier and the peaking amplifier have an impedance much greater than 50 Ohm at a point where a maximum output is produced. In other words, as illustrated in FIG. 9B, in the high power range, only when the load impedance changes from infinite peaking impedance to 50 Ohm, the maximum output of the Doherty amplifier can be obtained. However, in the "symmetric" mode, such operation is not carried out. On the other hand, in the amplifier using an asymmetric power drive in accordance with the present invention, the carrier amplifier and the peaking amplifier have an impedance of 50 Ohm at a point where the maximum output is attained. And, also, in the entire high power region, the load modulation occurs at a lower impedance in comparison with the case of an amplifier using a symmetric power drive. Therefore, the power amplifier using an asymmetric power drive in accordance with the present invention has high linearity while maintaining high efficiency and further produces a desired maximum output, thereby improving the overall utility of the solid-state device.

Figure 10A:
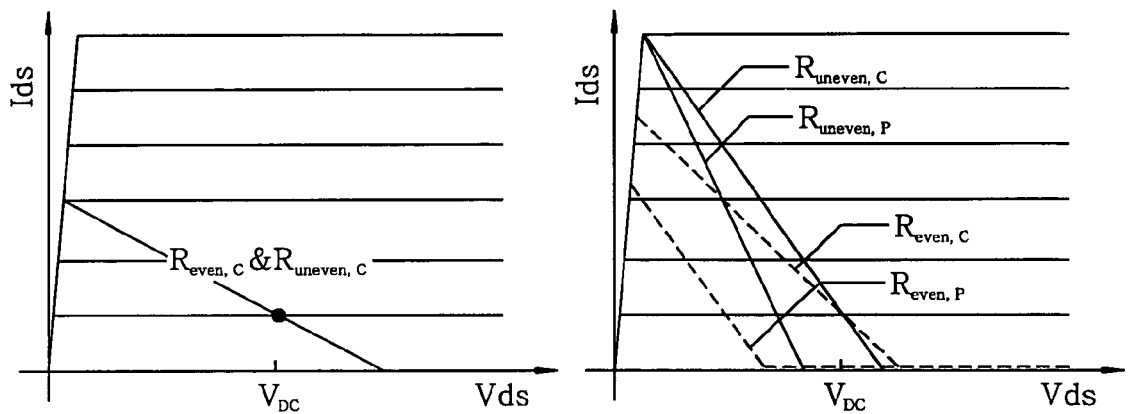
FIG. 10A provides a graph showing the load impedance of FIG. 9B in terms of a load line.
Figure 10B:
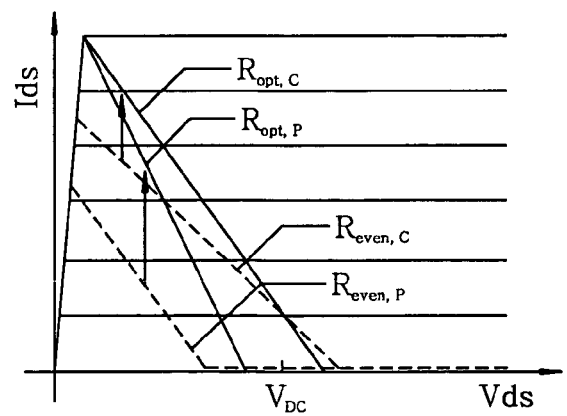
FIG. 10B presents a graph illustrating a load line, which is achieved by varying matching circuits to derive the changes of the load impedance of FIG. 9B in order to obtain a maximum output from the power amplifying apparatus in accordance with the present invention.

FIG. 10A provides a graph showing changes of the load impedance of FIG. 9B in terms of a load line.

A left graph in FIG. 10A illustrates a load line of the symmetric power drive and the asymmetric power drive, which is obtained when the peaking amplifier has just been turned on at a low power level. The load line is almost the same as that shown in FIG. 9B. That is, at the lower power level, the load impedance in the "asymmetric" and "symmetric" modes becomes twice, which is indicated by the load lines of the left graph of FIG. 10A.

A right graph in FIG. 10A shows the load lines of the symmetric and the asymmetric power drives at a point where a maximum power is attained. As shown in FIG. 9B, in case of the symmetric power drive, the maximum output cannot be achieved due to a large impedance. Moreover, in terms of linearity, a much lower load line is formed in comparison with the case of the symmetric power drive. In other words, in the "symmetric" Doherty amplifier, i.e., in the conventional Doherty amplifier having comparatively large impedance due to an improper load modulation, the load line having the large impedance prevents a production of the maximum output, which means that, in the "asymmetric" Doherty amplifier in accordance with the present invention, it is possible to achieve the maximum output.

FIG. 10B presents a graph illustrating load lines obtained by changing the load impedance of FIG. 9B in order to produce the maximum output of the power amplifying apparatus in accordance with the present invention.

In order to produce the maximum power for the large impedance caused by the improper load modulation in the Doherty amplifier using a symmetric power drive and further to enhance the linearity, the matching circuits should be changed so that the load line in the asymmetric power drive can be obtained. As shown in FIG. 10B, if an inclination of the load line increases by decreasing the large impedance, an optimized load line can be achieved. Accordingly, it is possible to enhance the linearity of the Doherty amplifier using a symmetric power drive, and further, to attain the maximum power.

Figure 11A:
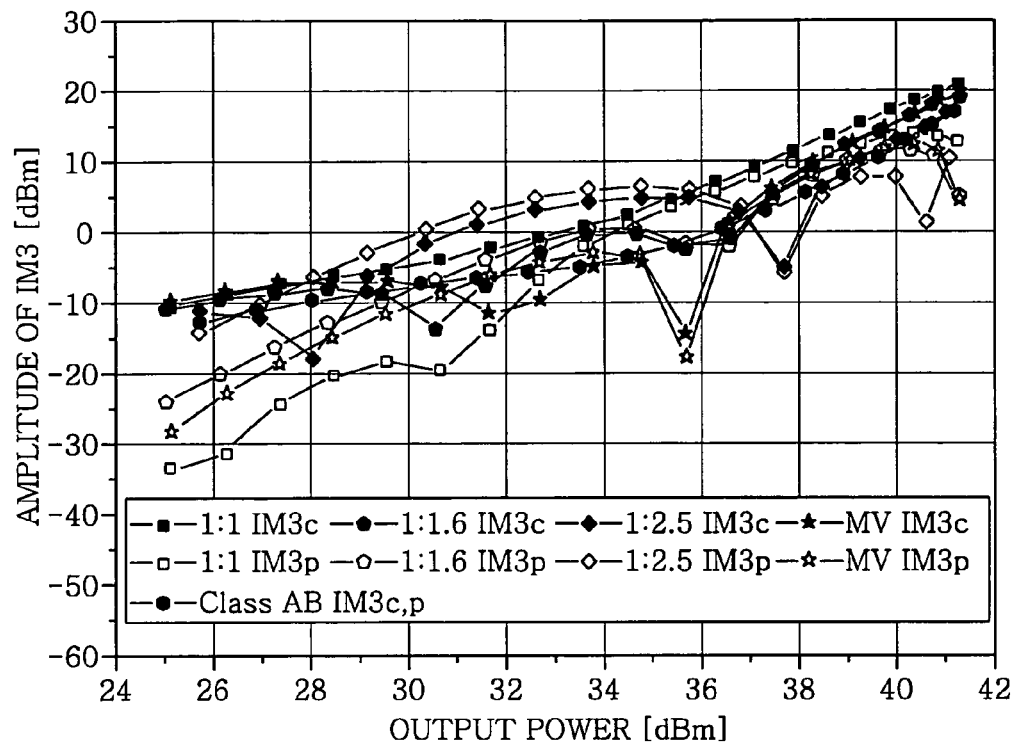
FIG. 11A depicts a two-tone simulation graph between an IM3 level and an average output.

FIG. 11A depicts a two-tone simulation graph between an inter-modulation three (IM3) level and an average output, wherein a reason that the Power amplifying apparatus using an asymmetric power drive in accordance with the present invention achieves the optimized linearity is analyzed by using the two-tone simulation.

For reference, IM3 denotes that an unknown signal is mixed with and then modulated together with two or more frequencies passing through a nonlinear system or a nonlinear circuit. Further, IMD refers to a distortion generated by such an inter-modulation. Especially, in case of the IM3 component, i.e., two-tone frequencies f1 and f2, although a signal having various hybrid components is outputted, multiple harmonics such as $2*f1$, $3*f2$ and so on can be removed by a filter. Since, however, third order harmonic frequencies overlapped with the f1 and the f2 signal, e.g., $2*f1-f2$ and $2*f2-f1$, cannot be removed even by the filter, they indicate an index of the linearity.

Moreover, the two-tone simulation indicates an analysis or a measurement performed by using two frequency components in a measuring device, a testing, a harmonic balance or the like. In case of measuring IMD and IM3, two-tone signals having offset frequencies (two-tone spacing) are introduced about a central frequency, to thereby analyze the IMD between the two signals, i.e., the linearity of the amplifier.

As shown in FIG. 11A, if the asymmetric power drive increases in term of the IM3, in other words, if x in 1:x, i.e., a ratio of the peaking power, increases, the distributions of IM3 levels in the carrier and the peaking amplifier become wider together in a region. On the other hand, in case where phases become opposite gradually by a decrease of the output power, the distributions of IM3 levels becomes narrower.

That is, the power amplifying apparatus having the optimized linearity proposed by the present invention achieves the high linearity by employing a method for offsetting the IM3 level of the carrier and the peaking amplifier. In this case, the IM3 level of each amplifier is lower than that of the class AB power amplifier. Moreover, as the level becomes lower, the IM3 level is further offset, thereby considerably improving the linearity. Accordingly, the carrier and the peaking amplifier should be so designed as to have the optimized linearity. Especially, in a low power level, the peaking amplifier is turned off and, further, only the carrier amplifier operates. Therefore, it is preferable to design the carrier amplifier so as to operate linearly. Matching variations (MV) illustrated in FIGS. 11A and 11B were compared between the asymmetric power driven carrier and peaking amplifier that are so designed as to more linearly operate by employing the aforementioned concept.

Figure 11B:
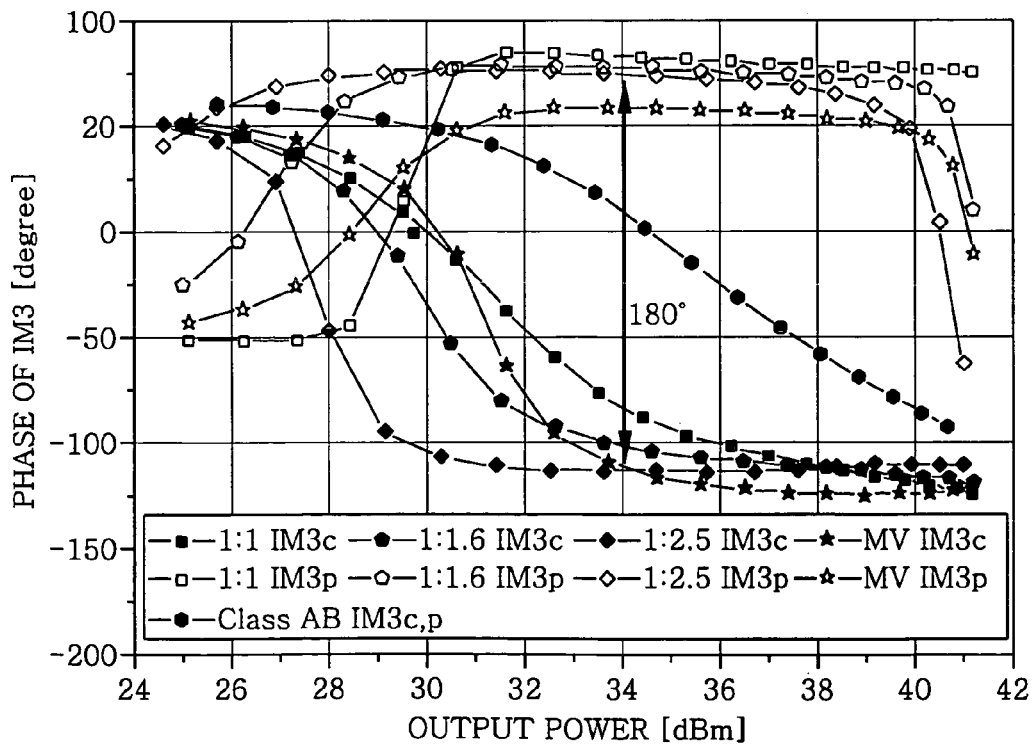
FIG. 11B represents a two-tone simulation graph between an IM3 phase and an average output.

FIG. 11B represents a two-tone simulation graph between an IM3 phase and an average power, wherein a reason that the Power amplifying apparatus using the asymmetric power drive achieves the optimized linearity is analyzed by using the two-tone simulation as in FIG. 11A.

As illustrated, when the phase difference between the carrier amplifier and the peaking amplifier becomes 180 degrees due to the increase of the output power and the IM3 levels of the amplifiers are the same, the offset effect is produced. In case of the power amplifiers using the asymmetric power drive, a region corresponding to the phase difference of 180 degrees is more widely distributed. That is, in the high power level, it is preferable to design the amplifiers in a way that the IM3 levels of the carrier and the peaking amplifier are the same and the phase difference therebetween becomes 180 degree, to thereby effectively carry out the offset of the amplifiers. To summarize, referring to FIG. 11B, as the asymmetric power drive increases, the IM3 phase of the carrier amplifier increases from a low average output point toward a down (negative value) direction. In contrast, the IM3 phase of the peaking amplifier increases toward an up (positive value) direction, thereby enlarging the region corresponding to the phase difference of 180 degree. Further, if the matching circuits are changed so as to achieve optimized impedance, the phases are not considerably changed, whereas the IM3 level decreases as shown in FIG. 11A. Furthermore, as the asymmetric power drive increases, the IM3 level decreases in a high average output region. Accordingly, when the IM3 levels are low and same and the phases are opposite from each other, the carrier and the peaking amplifier can be linearly designed with a proper load modulation, thereby achieving the optimized linearity.

Figure 12:
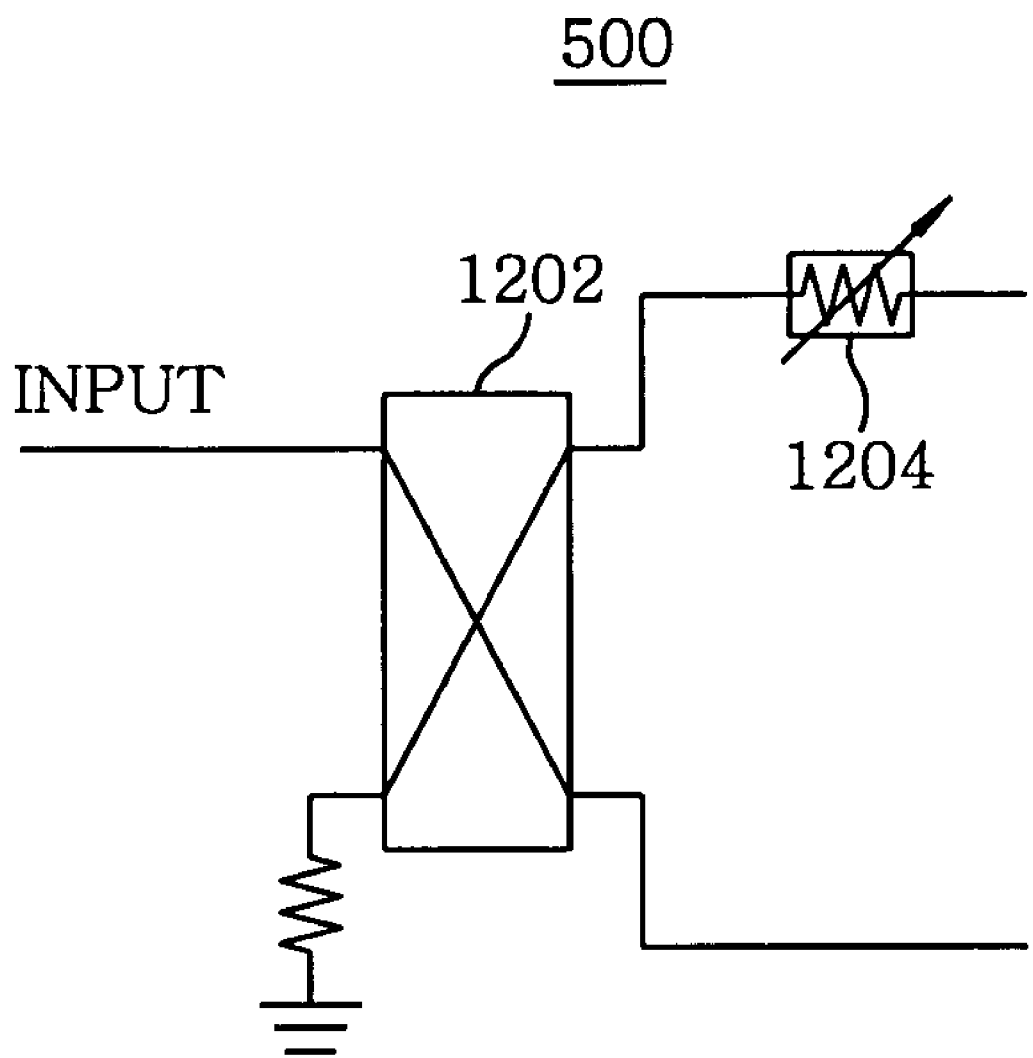
FIG. 12 offers a detailed block diagram of the asymmetric power driver shown in FIGS. 5 and 6.

FIG. 12 illustrates an example of the asymmetric power driver 500 illustrated in FIG. 5. Although it is not particularly described and shown, it is understood that the asymmetric power driver illustrated in FIG. 5 is equally applied to all the preferred embodiments of the power amplifying apparatus in accordance with the present invention.

The asymmetric power driver 500 includes a 3 dB hybrid coupler 1202 and an attenuator 1204. The 3 dB hybrid coupler 1202 is used for a symmetric power drive and serves to couple an input power to the carrier amplifier 504 and the peaking amplifier 506. The attenuator 1204 is connected between the 3 dB hybrid coupler 1202 and the carrier amplifier 504 to attenuate amplitude of the power to the carrier amplifier 504, thereby increasing a power to the peaking amplifier 506 relative to that of the carrier amplifier 504.

Alternatively, the 3 dB hybrid coupler may be substituted with a Wilkinson divider and, further, instead of the aforementioned attenuator 1204, an amplifier may be connected to an input matching circuit of the peaking amplifier 504, thereby enabling to increase the power drive of the peaking amplifier 504.

It has been described that the attenuator or the amplifier in this embodiment is connected to the input matching circuit of the carrier amplifier or that of the peaking amplifier, however, the connection of the attenuator or the amplifier may be changed for a relative difference in a power drive without being limited to the aforementioned connection.

Furthermore, the asymmetric power drive in accordance with the present invention can employ a method for making input power supplied to the peaking amplifier higher than that supplied to the carrier amplifier by 4 dB through the use of a coupler having an optional coupling ratio, e.g., a 5 dB coupler such as 1A1305-5 available from Anaren, Inc. in U.S.A.

Figure 13A:
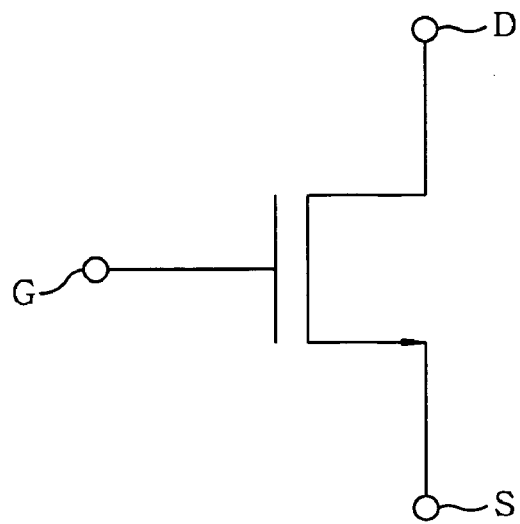
FIG. 13A illustrates a metal oxide semiconductor (MOS) device employed in the power amplifying apparatus in accordance with the present invention.
Figure 13B:
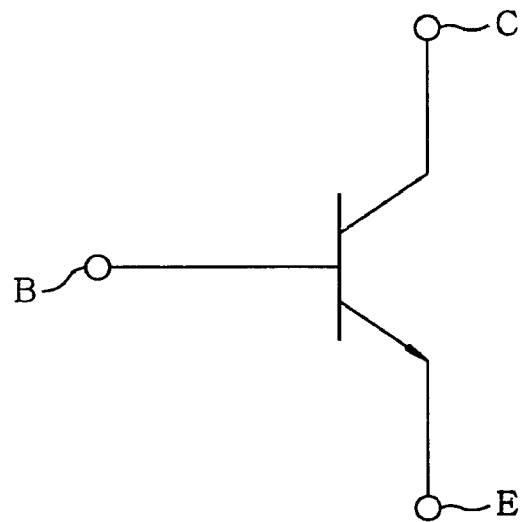
FIG. 13B depicts a base junction transistor (BJT) device employed in the power amplifying apparatus in accordance with the present invention.

FIGS. 13A and 13B describe examples of the carrier and the peaking amplifiers in accordance with the present invention.

As shown in FIG. 13A, each of the carrier and the peaking amplifiers includes a metal oxide semiconductor (MOS) FET device, which has a gate terminal G for applying a gate bias together with an input matching circuit in the carrier/peaking amplifier, a drain terminal D for applying a drain bias together with an output matching circuit in the carrier/peaking amplifier and a source terminal S grounded to an earth.

As shown in FIG. 13B, each of the carrier and the peaking amplifiers includes a base junction transistor (BJT) device, which includes a base terminal B for applying a base bias together with the input matching circuit in the carrier/peaking amplifier, a collector terminal C for applying a collector bias together with the output matching circuit in the carrier/peaking amplifier and an emitter terminal E grounded to an earth.

Figure 14:
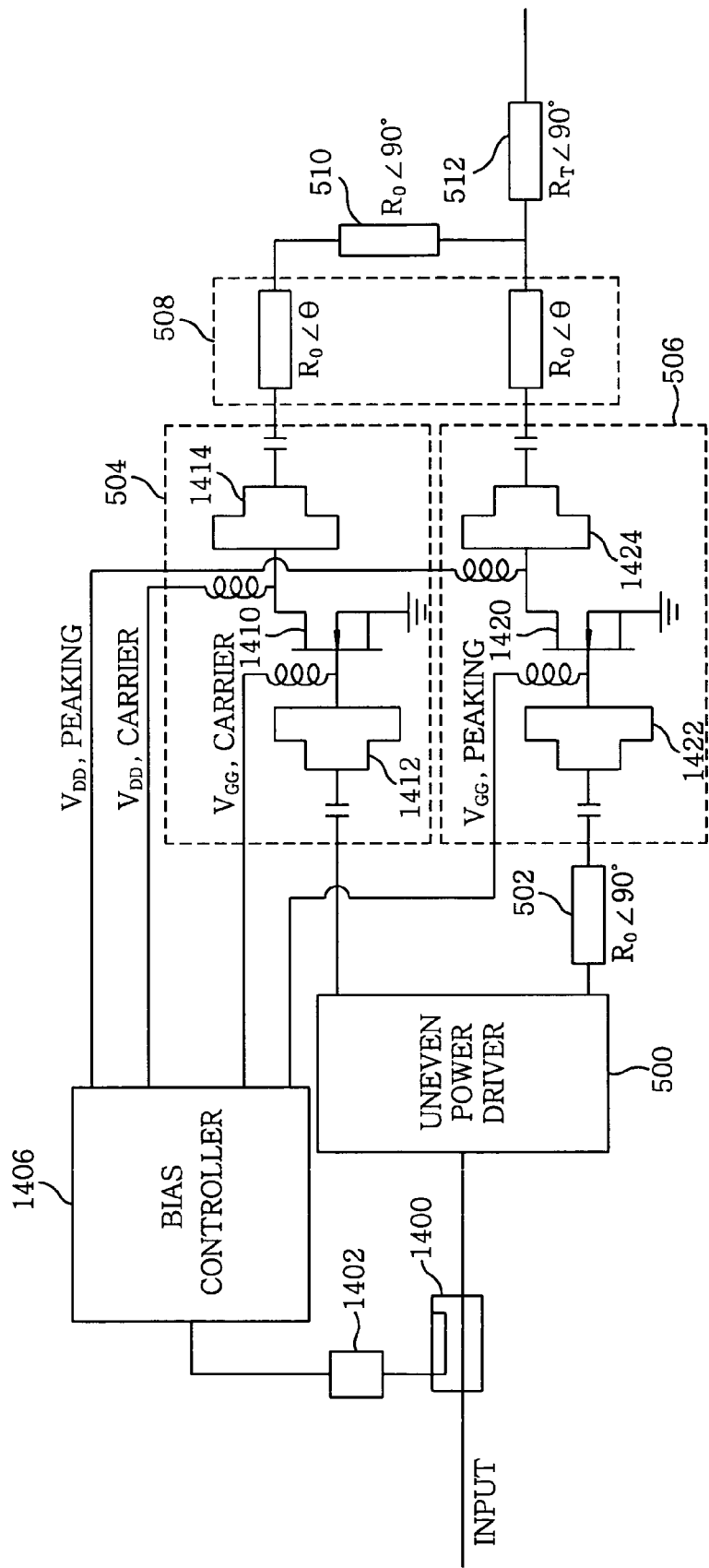
FIG. 14 describes a block diagram of a power amplifying apparatus having a bias controller in accordance with the present invention.

FIG. 14 describes an exemplary block diagram of the power amplifying apparatus shown in FIG. 5 provided with a bias controller.

The power amplifying apparatus includes a coupler 1400, a power detector 1402, a bias controller 1406, an asymmetric power divider 500, a transmission line 502, a carrier amplifier 504, a peaking amplifier 506, an offset line 508, a first quarter-wave transmission line 510 and a second quarter-wave transmission line 512.

The carrier amplifier 504 is provided with a MOS FET 1410 described with reference to FIG. 13A, an input matching circuit 1412 and an output matching circuit 1414, wherein the input and the output matching circuits 1412 and 1414 are connected by the MOS FET 1410. To be more specific, the gate terminal G and the drain terminal D of the device 1410 are connected to the input and the output matching circuit 1412 and 1414, respectively.

Similarly, the peaking amplifier 506 is provided with MOS FET 1420, an input matching circuit 1422 and an output matching circuit 1424, wherein the input and the output matching circuits 1422 and 1424 are connected by the MOS FET 1420. More specifically, the gate terminal G and the drain terminal D of the device 1420 are connected to the input and the output matching circuit 1422 and 1424, respectively.

The bias controller 1406 is connected to the carrier and the peaking amplifier 504 and 508, respectively. The bias controller 1406 controls a bias of the carrier and the peaking amplifiers 504 and 506, thereby optimizing the linearity and the efficiency of the power amplifying apparatus. More specifically, the bias controller 1406 applies gate bias voltages to the gate terminals G of the MOS FETs 1410 and 1420, respectively and further selectively applies drain bias voltages to the drain terminals D of the MOS FETs 1410 and 1420, respectively, thereby controlling the gate bias and the drain bias.

Remaining components are the same as those described in FIG. 5 and, thus, a detailed description thereof will be omitted for simplicity.

In this case, this embodiment can employ the BJT device described in FIG. 13B as well as the MOS FET device of FIG. 13A. A connection relationship and an operation thereof can be easily understood by those who skilled in the art and, thus, a detailed explanation will be omitted.

Hereinafter, the efficiency and linearity of the power amplifying apparatus having the aforementioned asymmetric power driver will be considered with reference to FIGS. 15A and 15B.

Figure 15A:
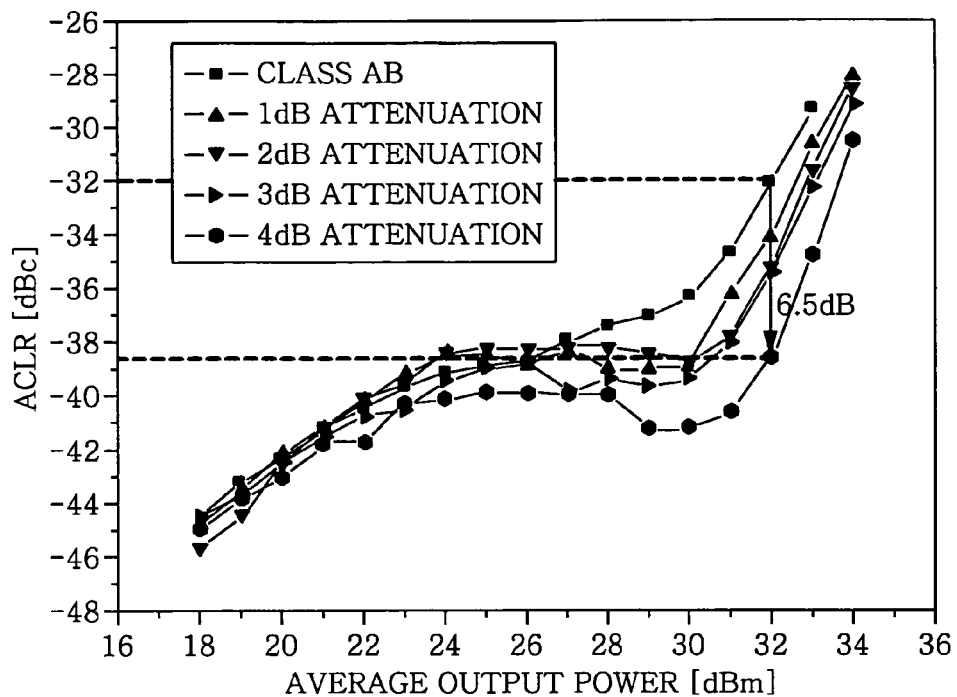
FIG. 15A describes a correlation graph between an adjacent channel leakage ratio (ACLR) and average output power of the power amplifying apparatus shown in accordance with the present invention.

FIG. 15A describes a graph showing an experiment result performed on the configuration shown in FIG. 12 so as to investigate an adjacent channel leakage ratio (ACLR), i.e., the linearity measured using an MRF281 device available from Motorola inc. in U.S.A., in terms of average output power. The ACLR denotes that a signal having a spectrum such as CDMA is compared using marker-to-marker on the spectrum between its own channel and an adjacent channel away from a frequency domain by a random offset. In other words, the ACLR indicates a value obtained by subtracting a marker of its own channel from another channel. The spectrum of the adjacent channel is generated by nonlinear characteristics of the amplifier. And also, ACLR is used for an index representing the linearity of the amplifier.

As shown in FIG. 15A, as the uneven ratio increases, the linearity becomes improved. This proves that the maximum output increases and, further, the performance is improved in terms of the efficiency.

Figure 15B:
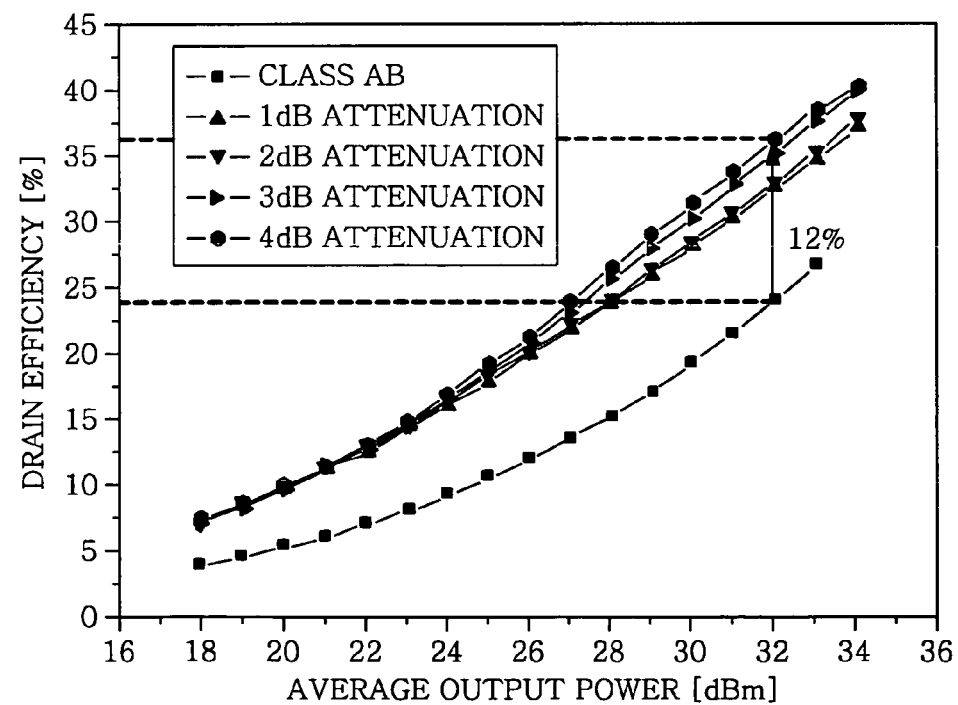
FIG. 15B illustrates a correlation graph between drain efficiency and average output power of the power amplifying apparatus in accordance with the present invention.

FIG. 15B illustrates a graph depicting a result of a drain efficiency experiment performed in terms of the average output power. As illustrated, the asymmetric power drive enables to achieve a high efficiency.

Based on such result, the power amplifying apparatus using the asymmetric power drive can achieve high linearity while maintaining the high efficiency.

Figure 16A:
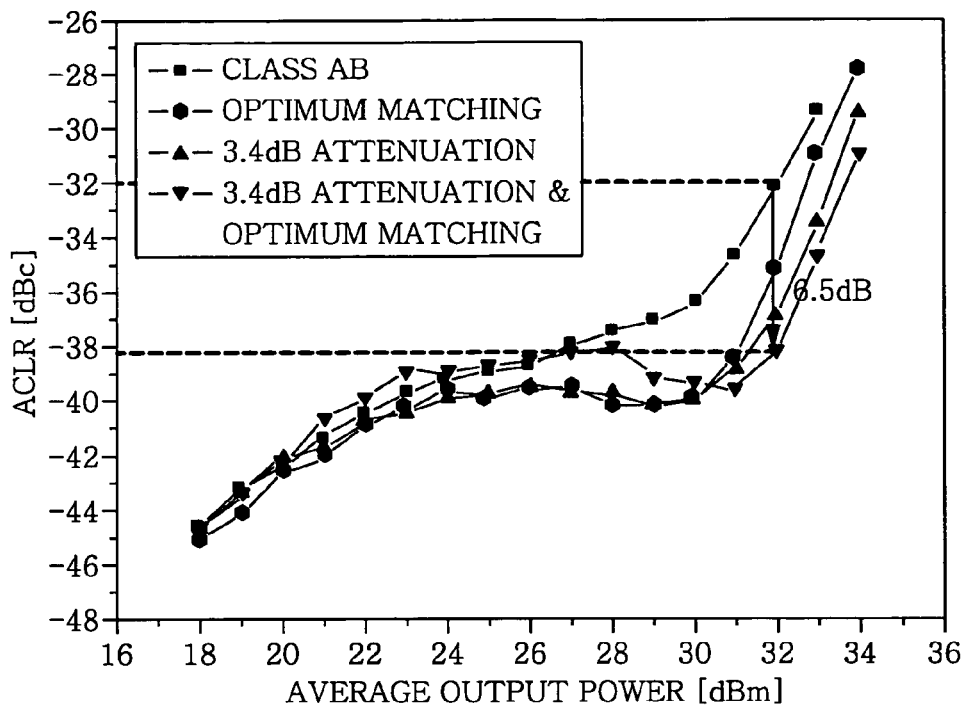
FIG. 16A is a correlation graph between an ACLR and average output power in an optimized matching circuit.
Figure 16B:
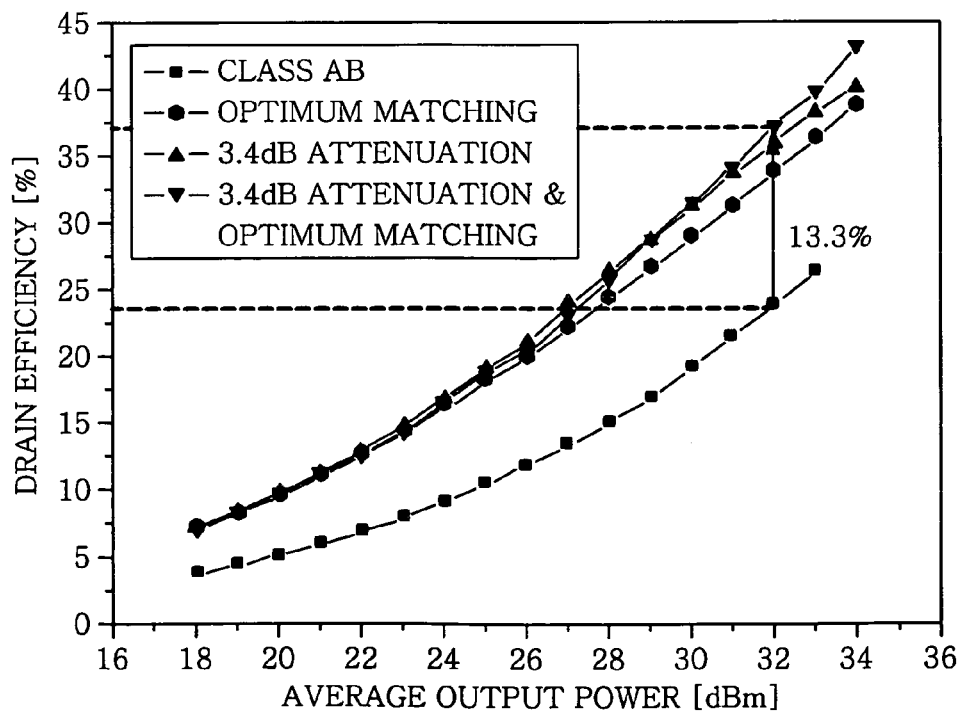
FIG. 16B shows a correlation graph between drain efficiency and the average output power in an optimized matching circuit.

FIGS. 16A and 16B represent graphs showing an experiment result obtained by employing the asymmetric power drive, wherein improvement degrees of the matching variation (MV) efficiency and the linearity are also checked by optimizing the matching circuits during the symmetric power drive.

Above all, FIG. 16A indicates ACLR characteristics in terms of the average output power. When the symmetric power drive has been employed and the matching circuit has been optimized, the ACLR is considerably improved in comparison with the class AB amplifier. Further, in case the matching circuit and the asymmetric power drive have been employed, the linearity is further improved in a high power level.

FIG. 16B illustrates the drain efficiency in terms of the average output. In case the matching circuit and the asymmetric power drive have been employed, the higher efficiency is achieved.

As a result, in case the conventional symmetric power drive has been employed; the loads of the carrier and the peaking amplifier considerably increase, thereby preventing the implementation of the optimized performance. Meanwhile, in case the asymmetric power drive in accordance with the present invention has been employed, it is possible to achieve the optimized linearity and the high efficiency.

The present invention can solve problems raised in the conventional microwave Doherty amplifies in which an improper load modulation occurs and a maximum output is not produced, thereby achieving the high efficiency and the optimized linearity. If the present invention is employed in an existing mobile communication network or in CDMA base-stations/handsets, the high efficiency and linearity can be achieved, thereby improving price competitiveness and reliability. Especially, the present invention can be simply implemented at a low cost by using an asymmetric power driver or a coupler for an asymmetric power drive.

While the invention has been shown and described with respect to the preferred embodiments, it will be understood by those skilled in the art that various changes and modification may be made without departing from the spirit and scope of the invention as defined in the following claims.

What is claimed is:

1. A Doherty amplifier, comprising:
a carrier amplifier and a peaking amplifier connected in parallel; and
an asymmetric power driving means for driving the carrier amplifier and the peaking amplifier using an asymmetric power drive,
wherein the asymmetric power driving means supplies an identical power to the carrier amplifier and the peaking amplifier and wherein a device size of the carrier amplifier is different from that of the peaking amplifier.

2. A Doherty amplifier, comprising:
a carrier amplifier and a peaking amplifier connected in parallel; and
an asymmetric power driving means for driving the carrier amplifier and the peaking amplifier using an asymmetric power drive,
wherein the asymmetric power driving means includes a coupler having an optional coupling ratio and supplies a power to the peaking amplifier higher than that supplied to the carrier amplifier.

3. A Doherty amplifier, comprising:
a carrier amplifier and a peaking amplifier connected in parallel; and
an asymmetric power driving means for driving the carrier amplifier and the peaking amplifier using an asymmetric power drive,
wherein the asymmetric power driving means includes:
a power divider for distributing an input power to the carrier amplifier and the peaking amplifier; and
an amplifier, interposed between the power divider and the peaking amplifier, for amplifying an amplitude of a power distributed to the peaking amplifier.

4. A power amplifying apparatus, comprising:
a Doherty amplifier having a single carrier amplifier and a plurality of peaking amplifiers, the carrier amplifier and the peaking amplifiers being connected in parallel;
an asymmetric power driving means for driving the carrier amplifier and the peaking amplifiers using an asymmetric power drive; and
a Doherty network, connected to an output end of the Doherty amplifier, for controlling a load impedance of the amplifying apparatus,
wherein the asymmetric power driving means supplies powers to the peaking amplifiers higher than that supplied to the carrier amplifier and amplitudes of the powers to the peaking amplifiers are identical to each other.

5. A power amplifying apparatus, comprising:
a Doherty amplifier having a single carrier amplifier and a plurality of peaking amplifiers, the carrier amplifier and the peaking amplifiers being connected in parallel;
an asymmetric power driving means for driving the carrier amplifier and the peaking amplifiers using an asymmetric power drive; and
a Doherty network, connected to an output end of the Doherty amplifier, for controlling a load impedance of the amplifying apparatus.
wherein the asymmetric power driving means supplies identical powers to the carrier amplifier and the peaking amplifiers and wherein a device size of the carrier amplifier is different from those of the peaking amplifiers.

6. A power amplifying apparatus, comprising:
a Doherty amplifier having a single carrier amplifier and a plurality of peaking amplifiers, the carrier amplifier and the peaking amplifiers being connected in parallel;
an asymmetric power driving means for driving the carrier amplifier and the peaking amplifiers using an asymmetric power drive; and a Doherty network, connected to an output end of the Doherty amplifier, for controlling a load impedance of the amplifying apparatus, wherein the asymmetric power driving means includes:

an optional coupler for distributing an input power to the carrier amplifier and the peaking amplifiers; and an amplifier, interposed between the optional coupler and the peaking amplifiers, for amplifying an amplitude of powers distributed to the peaking amplifiers.

7. A power amplifying apparatus, comprising:

a carrier amplifier and one or more peaking amplifiers connected in parallel, each having input and output matching circuits; and a means for driving the carrier amplifier and the peaking amplifiers using either an asymmetric power drive or a symmetric power drives, wherein the output matching circuits in the carrier amplifier and in the peaking amplifiers have load impedances different from each other.

8. The power amplifying apparatus of claim 7, wherein the load impedances of the input matching circuits in the carrier amplifier and in the peaking amplifiers are different from each other.

* * * * *